US006431112B1

(12) United States Patent
Sill et al.

(10) Patent No.: US 6,431,112 B1
(45) Date of Patent: Aug. 13, 2002

(54) APPARATUS AND METHOD FOR PLASMA PROCESSING OF A SUBSTRATE UTILIZING AN ELECTROSTATIC CHUCK

(75) Inventors: Edward L. Sill, San Diego, CA (US); William D. Jones, Phoenix; Craig T. Baldwin, Chandler, both of AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/565,606

(22) Filed: May 4, 2000

Related U.S. Application Data

(63) Continuation-in-part of application No. 09/334,046, filed on Jun. 15, 1999.

(51) Int. Cl.[7] ...................... C23C 16/509; C23C 16/503
(52) U.S. Cl. .............................. 118/723 E; 118/723 R; 361/234
(58) Field of Search .................. 361/234; 204/298.15; 156/345; 118/728, 723 E; 216/37

(56) References Cited

U.S. PATENT DOCUMENTS

| | | | | |
|---|---|---|---|---|
| 5,117,121 A | | 5/1992 | Watanabe et al. | 307/130 |
| 5,376,213 A | * | 12/1994 | Ueda et al. | 156/345 |
| 5,567,267 A | * | 10/1996 | Kazama et al. | 156/345 |
| 5,591,269 A | | 1/1997 | Arami et al. | 118/723 R |
| 5,708,556 A | | 1/1998 | van Os et al. | 361/234 |
| 5,737,175 A | | 4/1998 | Grosshart et al. | 361/234 |
| 5,820,723 A | | 10/1998 | Benjamin et al. | 156/345 |
| 5,835,334 A | * | 11/1998 | McMillin et al. | 361/234 |
| 5,880,924 A | * | 3/1999 | Kumar et al. | 361/234 |
| 5,886,866 A | | 3/1999 | Hausmann | 361/234 |
| 6,074,488 A | * | 6/2000 | Roderick et al. | 118/728 |
| 6,108,189 A | * | 8/2000 | Weldon et al. | 361/234 |
| 6,120,661 A | * | 9/2000 | Hirano et al. | 204/298.15 |
| 6,136,211 A | * | 10/2000 | Qian et al. | 216/37 |

FOREIGN PATENT DOCUMENTS

| | | | |
|---|---|---|---|
| EP | 0 819 780 A2 | 1/1998 | |
| EP | 0 819 780 A3 | 5/1998 | |
| JP | 409074086 A | * 9/1995 | ....... H01L/21/3065 |

OTHER PUBLICATIONS

Berry et al, "Control of the radio–frequency wave form at the chuck of an industrial oxide–etch reactor", J. Vac. Sci. Technol. A 18(6). Nov. 2000.*

Shan et al, "Process kit and wafer temperature effects on dielectric etch rate and uniformity of electrostatic chuck", J. Vac. Sci. Technol. B 14(1). Jan. 1996.*

* cited by examiner

Primary Examiner—Gregory Mills
Assistant Examiner—Rudy Zervigon
(74) Attorney, Agent, or Firm—Wood, Herron & Evans, L.L.P.

(57) ABSTRACT

A processing system for processing a substrate with a plasma comprises a processing chamber configured for containing a plasma, a substrate support within the chamber, and a plurality of electrodes coupled to the substrate support. The electrodes are each positioned proximate the supporting surface and are electrically isolated from one another. An RF power source is coupled to each of the electrodes for biasing the electrodes, so that they are operable for creating a DC bias on a substrate positioned on the supporting surface. A first electrically capacitive structure is electrically coupled between the RF power source and at least one of the plurality of electrodes. The first electrically capacitive structure has a variable capacitance for varying the DC bias created on the substrate by the at least one electrode relative to the DC bias created on the substrate by at least one of the other electrodes of the plurality of electrodes. The varied DC bias thereby varies the effect of a plasma on one portion of the substrate relative to the effect of the plasma on another portion of the substrate.

11 Claims, 2 Drawing Sheets

APPARATUS AND METHOD FOR PLASMA PROCESSING OF A SUBSTRATE UTILIZING AN ELECTROSTATIC CHUCK

RELATED APPLICATIONS

This application is a continuation-in-part application of U.S. patent application Ser. No. 09/334,046, entitled "Process, Apparatus and Method for Improved Plasma Processing of a Substrate," filed Jun. 15, 1999, which application is incorporated herein by reference in its entirety.

FIELD OF THE INVENTION

This invention relates generally to the processing of a substrate utilizing a plasma in the production of integrated circuits, and specifically relates to the improvement of a plasma processing system such as one utilizing an electrostatic chuck to secure a substrate to a susceptor during processing.

BACKGROUND OF THE INVENTION

Gas plasmas are widely used in a variety of integrated circuit fabrication processes, including plasma etching and plasma deposition applications, such as PECVD. Generally, plasmas are produced within a processing chamber by introducing a low-pressure process gas into the chamber and then directing electrical energy into the chamber for creating an electric field therein. The electric field creates an electron flow within the chamber which ionizes individual gas molecules by transferring kinetic energy to the molecules through individual electron-gas molecule collisions. The electrons are accelerated within the electric field, producing efficient ionization of the gas molecules. The ionized particles of the gas and the free electrons collectively form what is referred to as a gas plasma.

Gas plasmas are useful in a variety of different processes. One commonly used plasma process is a plasma etch process wherein a layer of material is removed or "etched" from a surface of a substrate. In an etch process, the ionized gas particles of the plasma are generally positively charged, and the substrate is negatively biased such that the positive ionized plasma particles are attracted to the substrate surface to bombard the surface and thereby etch the substrate surface. For example, a substrate might be etched to remove an undesirable material layer or coating on the substrate before another layer is deposited. Such a pre-deposition etch process is often referred to a s etch cleaning of the substrate.

Other common plasma processes involve deposition, wherein a material layer is deposited upon the substrate. Chemical vapor deposition, or CVD, for example, generally involves the introduction of material gases into a processing chamber wherein the gases chemically interact and form a material layer or coating on the exposed substrate surface. A gas plasma can be utilized to enhance the chemical interaction. Consequently, such a CVD deposition process utilizing a plasma is referred to as plasma-enhanced CVD or PECVD. The plasma is utilized to provide energy to the process and enhance the deposition quality and/or deposition rate. Other plasma deposition processes also exist as are commonly understood by a person of ordinary skill in the art.

During plasma processing of a semiconductor substrate, it is often useful to apply an accelerating voltage to the surface of the substrate. The accelerating voltage or substrate bias is utilized to accelerate ions or other charged particles within the plasma to the substrate surface. In an etch process, the charged plasma particles are attracted to the substrate surface to actually bombard the surface and provide the etch as discussed above. In a deposition process, such as PECVD, the energy provided by such charged particle bombardment may be utilized to further enhance the deposition rate or to enhance the deposition quality, as mentioned above. Generally, biasing of the substrate in plasma enhanced etch and deposition processes is accomplished by capacitatively coupling an RF field from a susceptor or other substrate support, through the substrate, and to the exposed substrate surface which is to be etched, or which is to receive a deposited material layer. The susceptor is biased with an RF power supply and the capacitatively coupled RF field from the susceptor creates a relatively uniform DC bias potential across the substrate surface. The DC bias, in turn, affects the plasma to enhance the etch or deposition process.

Within a plasma processing system, the plasma will usually have particular non-uniformities associated therewith. For example, the plasma density is often greatest in the center of the plasma and the center of the processing chamber due to edge effects proximate the sides of the processing chamber. The non-uniformities in the plasma translate to non-uniformities and discrepancies within the etch and deposition processes in which the plasma is utilized. For example, an undesirable variation in etch rate may occur wherein the etch rate proximate the center of the substrate is greater than the etch rate proximate the outer edges of the substrate. Furthermore, within a plasma-enhanced deposition process, the deposition may be affected proximate the center of the substrate differently than at the edges of the substrate thus creating a non-uniform deposition layer and a non-uniform deposition rate radially across the wafer. It is thus an objective of the present invention to address plasma non-uniformities within plasma processing systems. It is further an objective to do so with a biased substrate.

During integrated circuit fabrication, the substrate being processed is supported within the processing chamber by a substrate support, commonly referred to as a susceptor. Oftentimes, the substrate is physically secured on the susceptor during processing, such as to improve heat transfer between the substrate and susceptor. One way of securing a substrate involves the use of an electrostatic chuck (ESC), which electrostatically attracts and secures the substrate to the susceptor. Electrostatic chucks are known in the art with one suitable design being shown in U.S. Pat. No. 5,117,121, which is incorporated herein by reference.

Generally, electrostatic chucks utilize one or more electrodes which are embedded in the susceptor. Also, the substrate might be used as an electrode. The susceptor is usually formed of a dielectric material, and an applied voltage on the electrodes causes a voltage gradient to develop within the dielectric material. The voltage gradient, in turn, affects the electrical charges on the surface of the substrate abutting the dielectric material of the susceptor such that charge differences are created between the substrate and susceptor electrodes. Thereby, the substrate is clamped to the electrostatic chuck due to attractive electrical forces between the differently charged surfaces of the susceptor electrodes and the substrate.

More specifically, with a unipolar electrostatic chuck, the voltage bias is applied to a single electrode in the susceptor and the substrate itself acts as a second electrode. In that way, the combination of the dielectric susceptor materials separating the electrode and substrate forms a parallel plate capacitor, and the attractive electrical force between the two electrodes effectively clamps the substrate to the susceptor.

Alternatively, in a bipolar electrostatic chuck, which is commonly utilized in existing processing systems, a voltage difference is applied across two or more electrodes embedded within the susceptor and spaced apart from each other. The multiple electrodes are separated by the dielectric material of the susceptor and therefore an electric field develops across the susceptor between the electrodes. When a substrate is placed on the susceptor, the electric field causes charges to accumulate on the back side of the substrate. The charges on the back side of the substrate and those on the electrodes attract one another to clamp the substrate to the susceptor. Electrostatic chucks are often utilized within plasma processing systems. Therefore, it is a further objective to address plasma non-uniformities within a processing system utilizing an electrostatic chuck.

Still further, as noted above, a substrate may be electrically biased in addition to being electrostatically clamped to a susceptor. It is therefore another objective of this invention to address the above-discussed objectives without adversely affecting the biasing of the substrate which is desirable for plasma processing.

SUMMARY OF THE INVENTION

The processing system, in accordance with the principles of the present invention, comprises a processing chamber for containing a plasma. A substrate support is mounted within the chamber for supporting a substrate proximate the plasma. A plurality of electrodes, such as first and second electrodes, are coupled to the substrate support. The electrodes are each positioned proximate the supporting surface and are electrically isolated from one another. An RF power source is coupled to each of the electrodes for biasing the electrodes with RF electrical energy. The biased electrodes are operable in conjunction with the substrate support, which is usually formed of a dielectric material, for creating a DC bias on a substrate positioned on the supporting surface of the substrate support. Generally, the electrodes are embedded within the dielectric material of the substrate support and the DC bias on the substrate is formed in accordance with known biasing principles.

In accordance with the present invention, electrically capacitive structures are used in conjunction with the electrodes to selectively vary the biasing created by the electrodes and to enhance the plasma process. In one embodiment, a first electrically capacitive structure is electrically coupled between the RF power source and at least one of the plurality of electrodes. The first electrically capacitive structure has a variable capacitance, which may be adjusted for selectively varying the DC bias created on the substrate by that electrode relative to the DC bias created on the substrate by the other electrodes of the plurality. In that way, the effect of the plasma on one portion of the substrate may be selectively varied relative to the effect of the plasma on another portion of the substrate, to achieve a desired result. The positioning of the electrodes and their selective biasing may be chosen to affect the plasma in numerous ways, such as to vary the etch or deposition rates proximate a selected area of the substrate.

In accordance with one embodiment of the present invention, the electrically capacitive structure is a variable capacitor, such as an air capacitor or a vacuum capacitor, and the capacitance of the variable capacitor may be selectively increased or decreased in accordance with the principles of the present invention. In another embodiment of the present invention, a second electrically capacitive structure, such as a second variable capacitor, is coupled to another of the electrodes so that the DC bias created by at least two of the electrodes may be selectively varied relative to each other to thereby further vary the effect of the plasma on separate portions of the substrate.

To maintain a constant power load on the RF power supply, the first and second capacitors might be operatively coupled together so that their capacitances might be varied in synchronization. In that way, the DC bias created on the separate electrodes may be selectively varied, such as by increasing the capacitance of one capacitor while decreasing the capacitance of the other capacitor, while still maintaining a generally constant power load on the RF power source coupled to the electrodes. In an embodiment of the present invention utilizing multiple capacitors, the capacitors are coupled to the RF power source in an electrically parallel orientation.

In accordance with another aspect of the present invention, the plurality of electrodes may take any number of particular shapes and positions in the susceptor necessary for selectively varying the bias on selected portions of a substrate. For example, in one embodiment of the invention, the plurality of electrodes comprises two electrodes, with one in the form of a disk for being positioned proximate the center of a substrate, while the other electrode is in the form of a ring for being positioned concentrically around the disk proximate an annular portion of the substrate. In that way, the center portion of the substrate may be biased differently from an annular portion of the substrate, such as the peripheral edges of the substrate. In another embodiment, the electrodes may take the form of multiple portions of a disk, such as two halves of a circular disk-shaped electrode.

In accordance with another aspect of the present invention, the electrodes and variable capacitors may be incorporated into a processing system in combination with an electrostatic clamping device. To that end, the electrodes may also be coupled to a DC power source which is operable for creating a DC potential difference between at least two of the electrodes of the plurality to electrostatically clamp a substrate to the supporting surface of the substrate support. To that end, the electrodes are used for both electrostatically clamping the substrate and for selectively affecting the plasma proximate the substrate in accordance with the principles of the present invention. Generally, due to the physical nature of the electrostatic clamping force, the surface of the substrate, which is biased by the RF-created DC bias to affect the plasma, is not affected by the electrostatic clamping force created by the DC power source.

These features and benefits of the invention, and other features and benefits are set forth in greater detail in the Detailed Description hereinbelow made in reference to the drawing figures.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
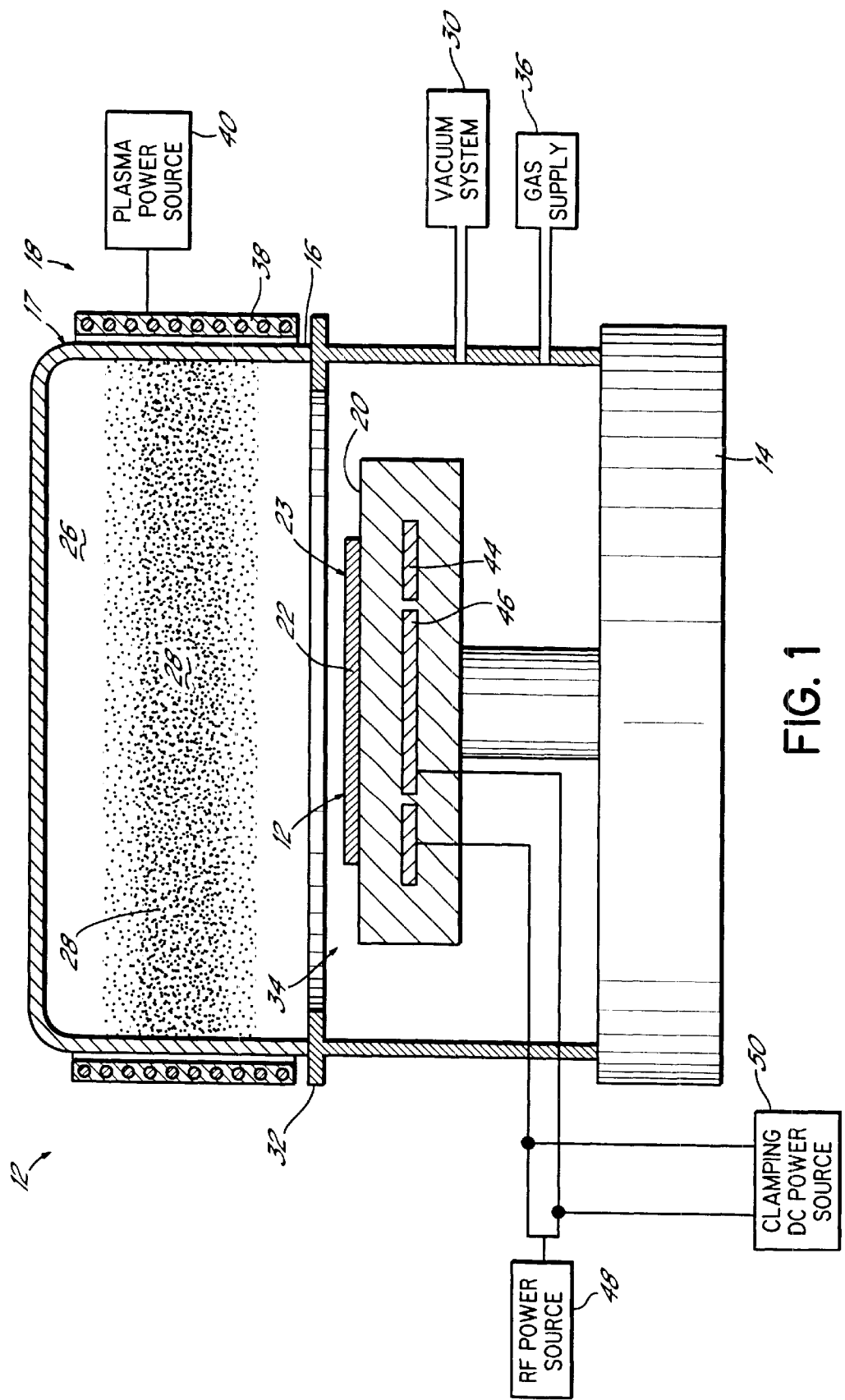
FIG. 1 is a side cross-sectional view of one embodiment of a plasma processing system in accordance with the principles of the present invention.

FIG. 1 illustrates one embodiment of a plasma processing system in accordance with the principles of the present invention. The plasma processing system generally comprises a processing chamber 12, including a base section 14 formed of a suitable metal, such as stainless steel, and a dielectric section 16 formed of a suitable material such as quartz. A plasma-generating assembly 18 is coupled to the dielectric section 16 of the processing chamber 12 for introducing RF energy into a process space 26 to form and sustain a plasma. A substrate support assembly or susceptor 20 is positioned within the processing chamber 12 and is configured for supporting a semiconductor wafer or substrate 22 therein for plasma processing. The processing chamber 12, and specifically, the dielectric section 16 defines process space 26 therein for containing a plasma 28. The substrate 22 is positioned below the process space 26 and plasma 28 in the embodiment of FIG. 1.

In one embodiment of the present invention, the processing system may be a stand-alone plasma processing system which is utilized for an isolated plasma process. In another embodiment, the processing system may be configured to be incorporated into a multi-process system with a plurality of other processing systems and a centrally located substrate transfer module, not shown, which moves substrates between the various systems. Such multi-chamber, multi-process systems are known in the art.

For plasma processing, process space 26 must be under vacuum. Thus the processing chamber 12 is coupled to an appropriate vacuum system 30 including suitable vacuum pumps and valves, as are known in the art, for providing the desired vacuum pressure within process space 26. The processing chamber 12 is appropriately configured with the necessary openings for introducing a vacuum into space 26, as is known in the art.

The plasma-generating assembly 18 is shown in FIG. 1 electrically coupled to the dielectric section 16 of processing chamber 12. The plasma-generating assembly 18 couples RF electrical energy into the dielectric section 16, which is often referred to in the art as a "bell jar" enclosure, and thereby forms a plasma 28 in the process space 26 above substrate support assembly 20 (see FIG. 1). The dielectric section or enclosure 16 is seated on a flange 32 of base 14 which surrounds the open top 34 of base 14. Suitable O-ring seals and other seals (not shown) are usually positioned between the base 14 and dielectric section 16 for proper vacuum sealing.

For forming a plasma within space 26, a process gas is introduced into the space 26 and electrical energy is electrically coupled into the space to ionize the gas particles to form a plasma. To that end, the processing chamber is coupled to an appropriate process gas supply 36 which introduces a suitable process gas for forming a plasma 28. Any appropriate gas dispersing element (not shown) may be coupled to gas supply 36 for uniformly introducing the process gas, such as Argon, into space 26 for forming a uniform and dense plasma.

To ignite and sustain a plasma within space 26, the plasma generating assembly includes an inductive element in the form of a helical coil 38 which is wound around dielectric section 16, as illustrated in FIG. 1. The coil 38 is essentially an elongated conductor formed in the shape of a helical coil which is dimensioned to fit around section 16 and up against an outer wall surface 17 of the enclosure. Coil 38 is coupled to a plasma power source 40 which conventionally includes an RF power supply and appropriate RF matching circuitry for efficient inductive coupling of RF power to the coil 38. RF electrical energy from the power source 40 is preferably inductively (rather than capacitively) coupled into the process space 26 to excite the process gas to form plasma 28. Inductively coupled plasmas and the formation of same are known in the art and various different configurations may be utilized for inductively coupling energy into the process space 26. Therefore, FIG. 1 discloses, in a broad conceptual form, only one possible embodiment for inductively coupling a plasma into the processing chamber 12. For example, the coil may be positioned at a top end of the section 16 to couple energy into the plasma from above chamber 12.

Furthermore, it will be readily understood by a person of ordinary skill in the art that a plasma processing system suitable for use in the present invention may take any one of a number of different forms and include differently configured processing chambers. For example, another inductively coupled plasma processing system might utilize a flat coil (as opposed to a helical coil) which is positioned on the top of the processing chamber where energy is coupled through a dielectric window at the top of the chamber. Furthermore, the plasma might be formed capacitatively, rather than inductively. In such a capacitatively coupled system, an electrode element in the process space 26, such as an electrically biased gas-dispersing showerhead (not shown), is utilized in combination with another electrode, such as a biased substrate support assembly 20 and substrate 22. An electric field between the electrodes sustains a plasma proximate the substrate. Accordingly, the present invention may be incorporated with various different plasma processing systems using inductively coupled plasmas or capacitatively coupled plasmas or systems which otherwise form a plasma for processing a semiconductor substrate 22.

In the present invention, multiple electrodes are used to shape a plasma to improve the processing results associated therewith. Referring again to FIG. 1, the embodiment of the invention illustrated therein comprises a plurality of electrodes, including a first electrode 44 coupled to the substrate support 20 and a second electrode 46 also coupled to the substrate support proximate the first electrode 44. The second electrode 46 is generally spaced from the first electrode 44 and is electrically isolated therefrom. The present invention anticipates the use of multiple electrodes for creating a DC bias on the substrate and selectively varying that DC bias. Therefore, the present invention as disclosed covers systems utilizing at least two electrodes, but possibly a greater number of electrodes, and the claims cover such a multiple electrode processing system. For easier reference herein and in describing the invention, the electrodes illustrated in the drawings are designated as a first electrode 44 and second electrode 46, although as noted, a third, a fourth, and other electrodes might also be utilized in other embodiments of the invention. Furthermore, the first and second electrodes may be alternatively designated. For example, in the embodiments illustrated in FIGS. 1–3 and 5A, 5B, the multiple electrodes include an outer ring electrode 44 which is designated as a first electrode and an inner disk-shaped electrode 46 which is designated the second electrode. However, such designations may be reversed, such that the electrode 44 is designated the second electrode and the electrode 46 is designated the first electrode.

In accordance with another aspect of the present invention, the DC bias on each electrode is selectively varied relative to the other electrode. To that end, the bias of one electrode might be selectively varied with respect to a constant bias on the other electrode, or vice versa. Alternatively, the bias of both (or more) electrodes might be selectively varied relative to each other in accordance with the principles of the present invention. Accordingly, the designation of the electrodes as first and second electrodes in the drawings for purposes of illustrating the invention, should not be construed as limiting the invention in any way.

In one embodiment of the invention, the first and second electrodes 44, 46 are embedded within the substrate support or susceptor 20. The substrate support 20 is preferably formed of a dielectric material, such as aluminum nitride. The electrodes may be of a suitable electrically conductive material such as molybdenum. Suitable electrodes 44, 46 are available as 120 micron thick molybdenum electrodes from N.G.K. of Japan. For example, suitable electrodes might be formed of a molybdenum mesh material having a plurality of interlaced 120 micron molybdenum wires. The mesh allows the aluminum nitride of the susceptor to be formed around the electrodes in a strong physical interaction. Other suitable electrode materials and designs may also be utilized in accordance with the principles of the present invention.

Electrodes 44 and 46, as discussed hereinbelow, are coupled to an RF power source which includes an appropriate RF power supply for delivering RF power to the electrodes (see FIG. 2). In one embodiment of the invention, the electrodes 44, 46 are also utilized to electrostatically clamp substrate 22 to the substrate support 20. To that end, the electrodes 44, 46 are coupled to a clamping DC power source 50 which induces a DC bias on the electrodes to form a suitable electric field, which clamps substrate 22 in accordance with well-known electrostatic clamp principles (see FIG. 3). The RF power source 48 in combination with the biased electrodes 44, 46 forms an RF-created DC bias on substrate 22 and specifically on an upper surface 23 of the substrate which faces plasma 28. The bias on substrate surface 23 accelerates ions and other charged particles within the plasma 28 to the surface 23. Such substrate bias enhances etching in a plasma etch process, or is used to enhance deposition, such as in a plasma-enhanced chemical vapor deposition process. While it is known to bias a substrate in such a way for enhancing etching and deposition processes, there has generally been little control over such biasing, and the plasma processes have been left to the vagaries of the plasma 28 formed within the process space 26.

Figure 2:
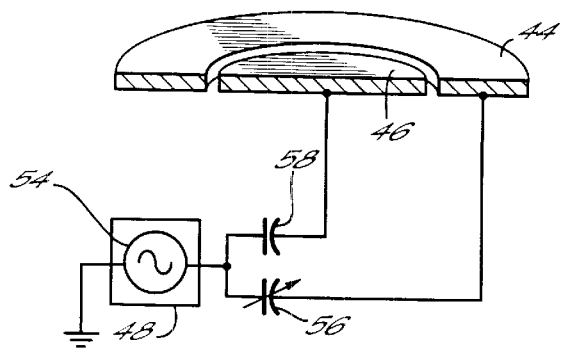
FIG. 2 is a perspective and schematic view of one embodiment of the invention.
Figure 3:
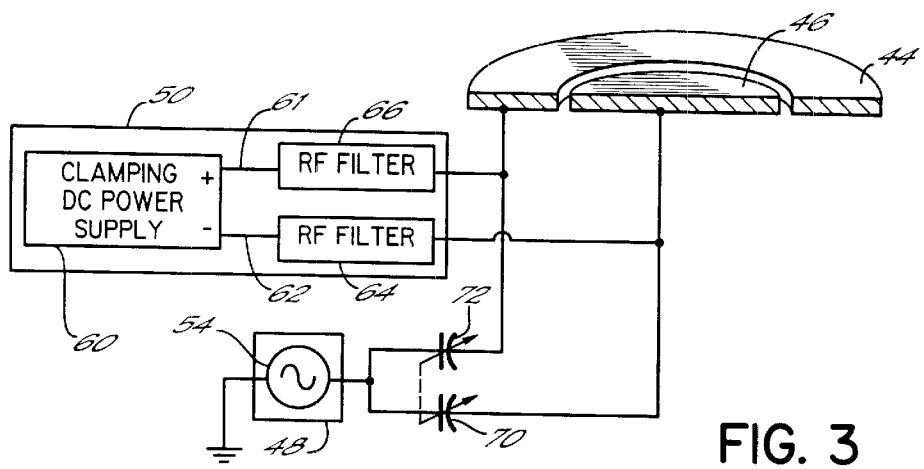
FIG. 3 is a perspective and schematic view of another embodiment of the invention.

Turning now to FIG. 2, one embodiment of the invention is illustrated showing a cut-away perspective view of the first and second electrodes 44,46. The first and second electrodes 44, 46 are coupled to the RF power source 48 which includes an RF power supply 54 capable of producing a suitable RF signal to bias the electrodes. In accordance with the principles of the present invention, electrically capacitive structures are electrically coupled between the RF power source 48 and the electrodes 44, 46, and one or more of the electrically capacitive structures has a variable or adjustable capacitance for varying the DC bias created on the substrate by at least one of the electrodes relative to the DC bias created on the substrate by at least one of the other electrodes. In the embodiment illustrated in FIG. 2, the first electrode 44 is coupled to a first electrically capacitive structure 56 having a selectively variable capacitance. That is, the capacitance of the capacitive structure 56 may be selectively adjusted so that its electrical capacitance is increased or decreased. The second electrode 46 is coupled to the RF power source 48 by a second capacitive structure 58. In the embodiment illustrated in FIG. 2, the second capacitive structure has a fixed or non-adjustable capacitance. However, both the first and second capacitive structures 56, 58 might have variable capacitances, as illustrated in FIG. 3 and discussed further hereinbelow. Suitable capacitive structures to be used in the present invention are conventional variable capacitors, such as air capacitors or vacuum capacitors.

As noted above, with respect to the designation of first and second electrodes, the capacitors 56, 58 are similarly designated for the purpose of illustrating the invention. It is contemplated that more than two electrodes might be utilized and, therefore, more than two capacitors, either all being variable, or a combination of variable and fixed capacitors might be utilized for coupling the various electrodes to the RF power source 48. Accordingly, the indication of capacitors as first and second capacitors herein should not in any way be construed as limiting with respect to the scope of the invention. Furthermore, while the first capacitor 56 between the RF power source 48 and the first electrode 44 is shown in FIG. 2 as being variable, and while the second capacitor 58 is shown as having a fixed capacitance, the order might be reversed and the second capacitor 58 might be variable while the first capacitor 56 has a fixed capacitance. Still further, both capacitors could be variable.

In accordance with another aspect of the present invention, the inventive method might be practiced by selectively varying the effective capacitances introduced by capacitors 56 and 58 by selectively changing fixed capacitors according to the selective DC bias on the electrodes which is desired. That is, the capacitances of the capacitors 56 and 58 might be fixed, whereby the method of selectively varying the DC bias is accomplished by replacing one or more of the components 56, 58 with another component having a different capacitance. That is, the selective variability of the capacitors is accomplished by replacing one or both of the capacitors with another capacitor having a different capacitance value. As such, one or more of the capacitors would not simply be adjusted, but rather would be replaced. Of course, as will be understood by a person of ordinary skill in the art, utilizing a variable capacitor would be easier than requiring replacement of fixed capacitors in order to achieve the desired selective bias of the electrodes.

In accordance with the principles of the invention, the selectively variable capacitors are utilized to selectively vary the DC bias created on the substrate by one of the electrodes relative to the DC bias created on the substrate by another of the electrodes. In that way, the effect of the plasma on certain portions of the substrate may be selectively varied. Specifically, electrical biasing of each of the electrodes relative to each other is selectively varied by varying the electrical capacitance of the capacitor coupled between a particular electrode and the RF power source 48. For example, the capacitances might be selectively varied so that one of the electrodes might be biased with a higher bias voltage than the other electrode, depending upon how the plasma is to be affected. A plasma in a confined space, such as plasma 28 in the processing chamber 12 will generally experience non-uniformities with respect to the plasma density. Particularly, the density of a plasma is most often greatest at the center of the chamber 12, and therefore, at the center of the substrate, rather than at the outer edges of the substrate. As a result, variations in etch rate, deposition rate, and other plasma-affected parameters may vary radially across the substrate. The present invention may be used to address such plasma non-uniformities and to address the radial variability of associated plasma parameters, including etch rates and deposition rates. In one embodiment of the invention, described herein, the electrodes 44, 46 are biased differently relative to each other to address the problem of a greater plasma density in the center of the plasma and substrate than at the outer edges. As will be readily understood by a person of ordinary skill in the art, various other plasma non-uniformities associated with a particular processing system might also be addressed by the present invention by varying the capacitance of the capacitors and thereby selectively manipulating the RF-created DC bias on one or more of the electrodes.

In FIG. 2, the first capacitor 56 has a variable capacitance which may be increased or decreased as necessary. In order to address a lower plasma density at the outer edges of a substrate, the first electrode 44 should be biased with a higher bias level so that a greater number of plasma particles are attracted to the outer annular or peripheral edge of the substrate to offset the lower density of particles. Decreasing the capacitance of capacitor 56 will increase the bias level on electrode 44.

For example, if both of the electrodes 44, 46 are biased similarly by the RF power source 48, with a power level in the range of 300–400 Watts, both of the electrodes might experience a bias level of approximately –100 Volts DC with reference to ground. As such, the electrodes would impose a generally uniform DC bias across surface 23 of the substrate 22 in the range of approximately –100 Volts DC. The uniform DC bias across the substrate surface 23 is then subject to the normal non-uniformities in the plasma 28. The amount of power delivered to the various electrodes 44, 46 will depend upon the capacitance properties of the respective capacitors 56, 58 coupled between those electrodes and the RF power source 48. In one aspect of the present invention, by decreasing the capacitance of variable capacitor 56, more power is delivered to the first or outer electrode 44, and thus the electrode 44 will maintain a higher DC bias level at an outer or annular portion of the substrate surface 23. Of course, by increasing the capacitance of the variable capacitor 56, an opposite result occurs wherein the second or center electrode 46 is maintained at a relatively higher bias, thus maintaining a center portion of the substrate surface 23 at a higher bias level. Maintaining a higher bias level at the outer, annular portion of the substrate surface 23 is desirable for addressing the reduced plasma density normally occurring at the outer edges of the plasma 28 to achieve a uniform etch or deposition rate across the substrate.

To obtain a somewhat similar effect and to increase the bias level on the outer electrode 44 relative to electrode 46, the second capacitor 58 might be variable, whereas the first capacitor 56 is fixed. In that way, increasing the capacitance of the second capacitor 58 will decrease the amount of power delivered to the electrode 46 and decrease the bias level of electrode 46. This effectively increases the bias level proximate the outer, annular portion of substrate surface 23 relative to the bias level at the inner, or center, portion of substrate surface 23. Still further, both electrodes, 56 and 58 might be varied, similar to the embodiment illustrated in FIG. 3 and described hereinbelow, wherein each of the capacitors 56, 58 are adjusted to increase or decrease their capacitance relative to each other to achieve the desired relative bias level adjustments on the electrodes 44, 46 and across surface 23. For example, raising the relative bias level on the outer or first electrode 44 may involve decreasing the capacitance of capacitor 56, increasing the capacitance of capacitor 58, or both conditions simultaneously. As noted above, the selective variance of the capacitance may also be achieved by changing capacitors having fixed capacitance values to selectively vary the DC bias on the substrate. In its broad aspects, the capacitance of one capacitor is selectively varied relative to the other capacitor or capacitors. This may be done using variable capacitors or fixed capacitors having different capacitance values.

The present invention as described hereinabove with respect to FIG. 2 may be utilized in the plasma processing chamber with or without a substrate support which includes an electrostatic chuck. FIG. 3 discloses an alternative embodiment of the invention and also illustrates components which might be utilized to impose an electrostatic chuck feature on the substrate support utilizing the first and second electrodes 44, 46. Specifically, the clamping DC power source 50 is coupled to the electrodes 44, 46 to provide a DC potential difference between the electrodes and thus electrostatically clamp the substrate to the support 20 in accordance with well-known electrostatic clamping principles. The clamping DC power source would generally include a clamping DC power supply 60 with a positive terminal 61 and a negative terminal 62 coupled to the electrodes. In the embodiment illustrated in FIG. 3, the positive terminal 61 is coupled to the outer or first electrode 44 and the negative terminal 62 is coupled to the inner or second electrode 46. However, the DC clamping bias might be reversed and the electrostatic chuck would work equally well. When the present invention is utilized with an electrostatic chuck, RF filters 64, 66 are utilized to protect the clamping DC power supply 60 from damage by the RF power from power supply 54. The capacitors 70, 72 illustrated in the embodiment of FIG. 3 are both variable, and therefore, the capacitance of each may be varied for selectively varying the DC bias created on the substrate by one of the electrodes relative to the bias created on the substrate by the other electrode, as discussed above. When an electrostatic clamping feature is also incorporated with the invention, the capacitors 70, 72 provide isolation to the RF power supply 54 from the DC signal of power supply 60.

It may be desirable to vary the capacitances of the capacitors 70, 72 simultaneously and in synchronization. To that end, the capacitors could be configured for being adjusted in a synchronized fashion.

For example, it may be desirable to maintain a somewhat constant power load on the RF power supply 54 during processing. Accordingly, the variable capacitors 70, 72 are physically coupled or ganged together such that their capacitance values may be adjusted simultaneously, or rather, in synchronization, to provide a somewhat constant power load. Specifically, the ganged capacitors might be adjusted such that the capacitance of the first capacitor 72 is decreased while the capacitance of a second capacitor 70 is increased a similar amount to thereby provide a greater bias level on the first or outer electrode 44 relative to the second or inner electrode 46. The capacitors 70, 72 are electrically coupled to the power source 48 in a parallel orientation to the power supply 54 and thus their capacitances are added mathematically in series to present an overall capacitive load. Therefore, the overall power load presented to power supply 54 by the capacitors will be reflective of the cumulative of the sum of the capacitances of capacitors 70, 72. Thus, if one capacitor is increased, the other might be decreased by the same amount to maintain a generally constant power load. As such, by ganging the adjustment mechanisms together for the variable capacitors 70, 72, the relative differential DC bias between the electrodes 44, 46 might be varied and adjusted as discussed above while maintaining a relatively constant power load on the RF power supply.

Figure 5A:
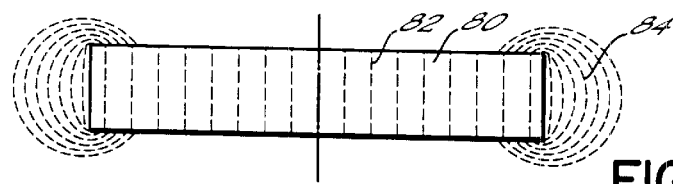
FIGS. 5A and 5B are side views of a schematic representation of the electric field associated with a prior art susceptor and one utilizing the present invention.
Figure 5B:
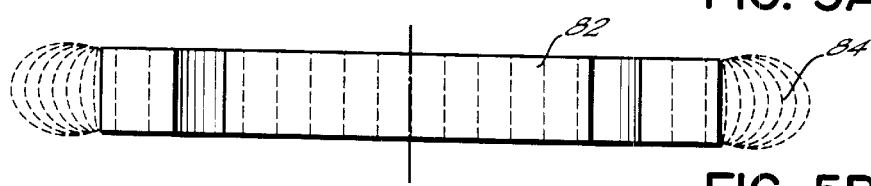

FIGS. 5A and 5B illustrate another benefit of the embodiment of the present invention utilizing a generally disk-shaped inner electrode and ring-shaped outer, or annular electrode. The substrate support 20, including a generally disk-shaped electrode for biasing the substrate has a finite size, and thus suffers from edge effects when the substrate is biased, somewhat similar to a parallel plate capacitor. Referring to FIG. 5A, the capacitor 80 models the electric field within a biased susceptor which does not utilize the present invention. Therein, field lines 82 are shown with edge effects 84 at the outer edges of the susceptor. Such edge effects cause a rapid change in the plasma process parameters at the edge of the substrate. This results in non-uniform etch and deposition rates at the substrate edges. FIG. 5B illustrates a similarly modeled capacitive electric field utilizing one embodiment of the present invention as illustrated in FIGS. 2 and 3 wherein the electric field lines 82 are maintained generally uniform in the center area, while the edge effects 84 are moved radially outward from the edge of the substrate, due to the outer electrode. As such the edge effects will have less of an impact on the plasma process parameters proximate the substrate edge.

Figure 4:
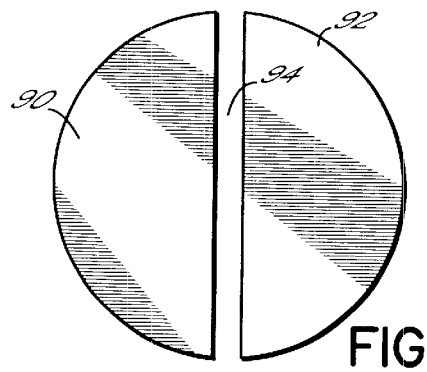
FIG. 4 is a top view of an alternative electrode arrangement in accordance with the principles of the present invention.

The present invention is not restricted to the specific concentric embodiment illustrated in FIGS. 2 and 3, but rather may be used to selectively vary the bias voltage between numerous electrodes for various geometric configurations. For example, in FIG. 4, an electrode configuration, often referred to as a double-D configuration, utilizes two electrodes 90, 92, having a gap 94 therebetween. Such a configuration is often utilized with an electrostatic clamp and thus may also be suitable for use with the present invention to vary the bias level proximate one side of the substrate relative to the other side of the substrate, such as to address plasma non-uniformities on one side of a process chamber versus the other side of the chamber. Another possible electrode configuration might utilize elements which mesh together.

It will be readily understood by a person of ordinary skill in the art that other electrode configurations would also be suitable for use with the present invention. Furthermore, more than two electrodes may also be utilized for further tailoring the bias on the substrate to address non-uniformities in the plasma processing system. For example, three or four concentric electrodes might be utilized, similar to the arrangement in FIGS. 1–3, to further tailor the effect on the plasma.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma comprising:
    a processing chamber configured for containing a plasma;
    a substrate support within the chamber having a supporting surface for supporting a substrate proximate the plasma;
    a plurality of electrodes coupled to the substrate support, the electrodes each being positioned proximate the supporting surface and being electrically isolated from one another;
    an RF power source coupled to each of the electrodes for electrically biasing the electrodes, the biased electrodes operable for creating a DC bias on a substrate positioned on the supporting surface;
    a first electrically capacitive structure electrically coupled between the RF power source and a first electrode of the plurality of electrodes but not between the RF power source and another of the plurality of electrodes;
    a second electrically capacitive structure electrically coupled between the RF power source and a second electrode of said plurality of electrodes;
    the first and second electrically capacitive structures having variable capacitances for selectively varying the DC bias created on the substrate by the first electrode relative to the DC bias created on the substrate by the second electrode and the first and second electrically capacitive structures being operably coupled together so that their capacitances may be varied in synchronization, the selectively varied DC bias thereby varying the effect of a plasma on one portion of the substrate relative to the effect of the plasma on another portion of the substrate.

2. The processing system of claim 1 wherein the first electrically capacitive structure is a variable capacitor.

3. The processing system of claim 2 wherein the variable capacitor is one of an air capacitor and a vacuum capacitor.

4. The processing system of claim 1 wherein at least one of the plurality of electrodes is in the form of a disk for being positioned proximate a center portion of a substrate on the substrate support to bias the center portion of the substrate.

5. The processing system of claim 1 wherein at least one of the plurality of electrodes is in the form of a ring for being positioned proximate an annular portion of a substrate on the substrate support to bias the substrate annular portion.

6. The processing system of claim 1 wherein at least two of the plurality of electrodes are in the form of multiple portions of a disk.

7. The processing system of claim 1 wherein the substrate support is formed of a dielectric material and the electrodes are embedded in the dielectric material.

8. The processing system of claim 1 further comprising a DC power source coupled to at least two of the electrodes, the DC power source operable for creating a DC potential difference between the at least two electrodes to electrostatically clamp a substrate to the supporting surface of the substrate support.

9. A processing system for processing a substrate with a plasma comprising:
    a processing chamber configured for containing a plasma;
    a substrate support within the chamber having a supporting surface for supporting a substrate proximate the plasma;
    a first electrode coupled to the substrate support;
    a second electrode coupled to the substrate support proximate the first electrode, the first and second electrodes each being positioned proximate the supporting surface and being electrically isolated from one another;
    a DC power source coupled to the first and second electrodes, the DC power source operable for creating a DC potential difference between the first and second electrodes to electrostatically clamp a substrate to the substrate support;
    an RF power source coupled to each of the electrodes for electrically biasing the electrodes, the biased electrodes operable for creating a DC bias on a substrate positioned on the supporting surface;

a first capacitor electrically coupled between the RF power source and the first electrode but not between the RF power source and the second electrode, and a second capacitor electrically coupled between the RF power source and the second electrode but not between the RF power source and the first electrode;

the first and second capacitors having variable capacitances for selectively varying the DC bias created on the substrate by the first electrode relative to the DC bias created on the substrate by the second electrode and the first and second capacitors being operably coupled together so that their capacitances may be varied in synchronization, the selectively varied DC bias thereby varying the effect of a plasma on one portion of the substrate relative to the effect of the plasma on another portion of the substrate.

10. The processing system of claim 9 wherein one of the first and second electrodes is in the form of a disk for being positioned proximate a center portion of a substrate on the support to bias the center portion of the substrate.

11. The processing system of claim 9 wherein one of the first and second electrodes is in the form of a ring for being positioned proximate an annular portion of a substrate on the support to bias the substrate annular portion.

* * * * *